(12) United States Patent
Johnson, Jr. et al.

(10) Patent No.: US 6,897,009 B2
(45) Date of Patent: May 24, 2005

(54) FABRICATION OF NANOMETER SIZE GAPS ON AN ELECTRODE

(75) Inventors: Alan T. Johnson, Jr., Philadelphia, PA (US); Marko Radosavljevic, Media, PA (US); Jacques Lefebvre, Ontario (CA)

(73) Assignee: Trustees of the University of Pennsylvania, Philadelphia, PA (US)

( * ) Notice: Subject to any disclaimer, the term of this patent is extended or adjusted under 35 U.S.C. 154(b) by 92 days.

(21) Appl. No.: 10/148,303

(22) PCT Filed: Nov. 29, 2000

(86) PCT No.: PCT/US00/42312

§ 371 (c)(1),
(2), (4) Date: Jan. 29, 2003

(87) PCT Pub. No.: WO01/39292

PCT Pub. Date: May 31, 2001

(65) Prior Publication Data

US 2003/0186167 A1 Oct. 2, 2003

Related U.S. Application Data

(60) Provisional application No. 60/167,851, filed on Nov. 29, 1999.

(51) Int. Cl.$^7$ ................................................. G03F 7/00
(52) U.S. Cl. ................... 430/315; 430/396; 977/DIG. 1
(58) Field of Search ................................ 430/311, 315, 430/322, 324, 329, 396; 977/DIG. 1

(56) References Cited

U.S. PATENT DOCUMENTS 6,177,231 B1     1/2001  Ishii et al. ............... 430/273.1
2004/0181630 A1 *  9/2004  Jaiprakash et al. ......... 711/127

OTHER PUBLICATIONS

R. Martel et al., "Single and multi–wall carbon nanotube field–effect transistor," *Applied Physics Letters*, vol. 37, No. 17, Oct. 26, 1998, pp. 2447–2449.

A. Bezryadin et al., "Electrostatic trapping of single conducting nanoparticles between nanoelectrodes," *Applied Physics Letters*, vol. 71, No. 9, Sep. 1, 1997. pp. 1273–1275.

J. Lefebvre et al., "Fabrication of nanometer size gaps in a metallic wire," *Applied Physics Letters*, vol. 76, No. 25, Jun. 19, 2000, pp. 3828–3830.

G. J. Dolan, "Offset masks for lift–off photoprocessing," *Applied Physics Letters*, vol. 31, No. 5, Sep. 1, 1977, pp. 337–339.

A. Ozaki et al., "Direct Nanolithography of Organic Polysilane Films Using Carbon Nanotube Tips," 2000 International Microprocesses and Nanotechnology Conference, 2000, pp. 194 and 195.

M. Brehob et al., "The Potential of Carbo–based Memory Systems," Records of the 1999 IEEE International Workshop on Memory Technology, Design and Testing, 1999, pp. 110–114.

Liu et al., "Controlled deposition of individual single–walled carbon nanotubes on chemically functionlized templates," Chemical Physics Letters vol. 303; Apr. 2, 1999; pp. 125–129.

* cited by examiner

Primary Examiner—Kathleen Duda
(74) Attorney, Agent, or Firm—RatnerPrestia

(57) ABSTRACT

A shadow mask method to fabricate electrodes with nanometer scale separation utilizes nanotubes (NTs). Metal wires with gaps are made by incorporating multi-wall carbon nanotubes (MWNTs) or single-wall carbon nanotubes (SWNTs) (or bundles thereof) into a tri-layer electron beam lithography process. The simple, highly controllable, and scaleable method can be used to make gaps with widths between 1 and 100 nm. Electronic transport measurements performed on individual SWNTs bridge nanogaps smaller than 30 nm. Metallic SWNTs exhibit quantum dot behavior with an 80 meV charging energy and a 20 meV energy level splitting. Semiconducting SWNTs show an anomalous field effect transistor behavior.

19 Claims, 2 Drawing Sheets

FABRICATION OF NANOMETER SIZE GAPS ON AN ELECTRODE

This application claims the benefit of U.S. Provisional application No. 60/167,851 filed Nov. 29, 1999.

FIELD OF THE INVENTION

The present invention relates to providing a molecular electronic device by fabricating nanogaps on an electrode.

BACKGROUND OF THE INVENTION

The rising interest in electrical properties of single molecules is triggered by physical properties that emerge at the transition between the atomic and the bulk scales. Moreover, there is a strong possibility that building blocks of future electronic devices will be found in such systems. One key challenge is attaching probes to nanometer size objects. Early methods to produce nanometer-size gaps ("nanogaps") were complex and provided a low yield. These include standard electron-beam (e-beam) lithography, break junctions, carbon nanorods, electrochemical growth, and electromigration.

As commercial integrated circuit design rules begin to incorporate sub-100 nm critical dimensions, the possibility of electronic devices based on single molecules is being widely considered. At this time, it has become possible, to make and measure the properties of electrical circuits containing one or a small number of molecules. Thus, in order to create such circuits, making molecular-scale gaps or nanogaps in an otherwise continuous metal, is necessary. If a molecule can be designed to attach itself across this gap, or if it can be drawn into the gap in some other way, a circuit results. This is the first step towards functional electronic devices containing many integrated molecules.

SUMMARY OF THE INVENTION

To meet this and other needs, and in view of its purposes, the present invention provides a method of fabricating nanogaps in an electrode. This method uses carbon nanotubes (NTs) as lithographic masks to create the gap in a metal wire. Single-wall carbon nanotubes (SWNTs) or multi-wall nanotubes (MWNTs) may be used. Since the width of the gap that is created is equal to the diameter of the NT used, the method can be used to create gaps ranging from 1 nm, which is the diameter of an individual SWNT, to more than 50 nm, which is the diameter of a large MWNT or a large bundle of SWNTs. Thus, using the present method, gaps ranging from 1 nm to 100 nm (in width) may be created. This method can link the molecular scale to that of "standard" electron beam lithography.

The present invention provides a method comprising the steps of: Coating a first layer onto a substrate; depositing at least one carbon nanotube on the first layer; coating a second layer over the first layer and the nanotube forming a trilayer component; forming a pattern in the first layer and the second layer, wherein the pattern comprises a recess across which the carbon nanotube extends; depositing a metal layer onto the substrate at the recess wherein the nanotube shadows the substrate, thereby creating a nanogap in the metal layer on the substrate; and dissolving the first layer, the second layer and the nanotube to form the electrode comprising the substrate and the nanogap within the metal layer.

The instant process relies on a tri-layer system with a partial monolayer of carbon nanotubes (NTs) embedded between two layers. There are a variety of two-layer systems that may be used in the present method. For example, a bottom layer, which acts as a spacer may be polymethylmethacrylate (PMMA), a photoresist, polyimide, any metal, or "spun on glass." The top layer, which is used for imaging may be PMMA, a photoresist, or other advanced electron beam (e-beam) resists. In a preferred embodiment, the two layers are made of an electron beam resist, such as PMMA. Other embodiments of the present invention include tri-layer systems including those based on photoresist or even just a top layer of resist and a bottom space layer. The low chemical reactivity of NTs implies that this method is likely to work with new resist systems as they are developed.

The present method fabricates metallic wires or electrodes with nanometer size breaks (nanogaps), which are ideal for use as metallic connections to molecular electronic circuits or circuits containing other nanometer size clusters. The method is scaleable, allowing the formation of many nanogaps. By using functional NTs in this self-assembly process, multiple electrodes with nanogaps can be fabricated simultaneously in controlled locations.

The NTs may be deposited at random. The present invention is also directed to a process of controlled fabrication of nanogaps in an electrode. In sum, the present invention is a highly controllable, and scaleable method to produce nanogaps with size between 1 and 100 nm by incorporating nanotubes into an e-beam lithography process. The method has been used to study the transport spectroscopy of individual SWNTs at this length scale.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention is directed to a method of fabricating nanogaps on an electrode. The invention may utilize single-wall nanotubes (SWNTs), or a bundle of SWNTs, or multi-wall "nanotubes" (MWNTs). For simplicity, as used herein, the term nanotube (NT) may refer to an SWNT, an SWNT bundle or an MWNT, all of which can be used for this process. Each of these forms of NTs is better suited for certain tasks. For example, individual SWNTs will provide the narrowest gaps, while the large mechanical rigidity of MWNTs are best for making long gaps. The instant method produces gaps that vary in size from 1 nm to 50 or 100 nm in diameter.

Figure 1:
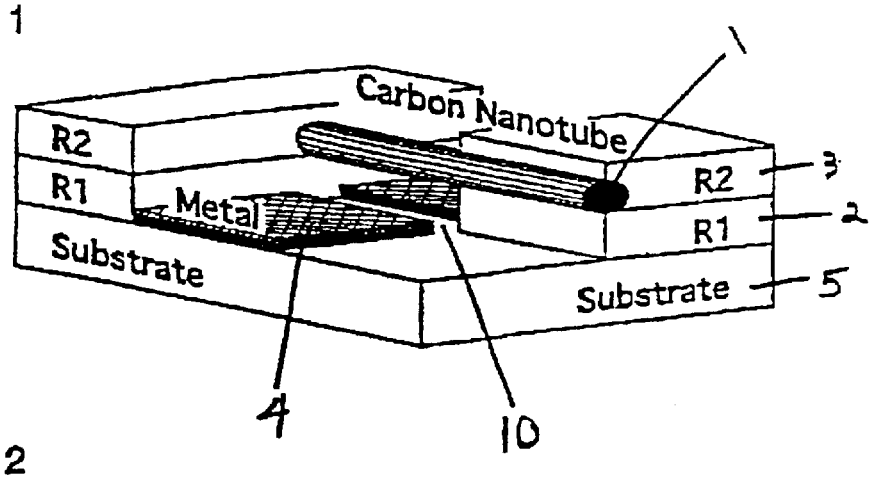
FIG. 1 is a perspective view of a tri-layer system of the present invention with a portion of the resist layers cut away.

FIG. 1 shows the profile of the tri-layer system with a partial monolayer of an NT 1 embedded between two layers, shown as first layer 2 and second layer 3. In an embodiment of the invention, the two layers are made of resist material (such as PMMA). However, as mentioned above, there are a variety of two-layer systems that may be used for the present method where the bottom layer acts as a spacer and the top layer is used for imaging of a pattern. After a layer of metal film 4 is deposited on a substrate 5, the first layer 2 and second layer 3 and the NT 1 will be dissolved, leaving the substrate 5 with the metal film 4 thereon having a nanogap 10. An exemplary fabrication process is described in more detail in connection with FIGS. 2A–2G below, and the depiction shown in FIG. 1 is similar to the structure which would be formed after completion of the step shown in FIG. 2F, as described below.

FIGS. 2A through 2G illustrate a nanogap fabrication process according to the present invention. In this example, two layers of resist are used with a carbon nanotube layer incorporated between the two layers. First, the first layer 2 (such as an e-beam resist layer) of, for example 80 nm in thickness, is coated onto an oxidized silicon substrate 5. Again, the material of the resist may be any resist which is known in the art. For example, material resists may be typically polymethylmethacrylate (PMMA), 950 kg/mol available from MicroChem Corp., Newton, Mass. The oxidized silicon substrate 5 is preferably 300 nm SiO2 on degenerate Si. The substrate 5 and the first layer 2 are then baked at 190° C.

Figure 2:
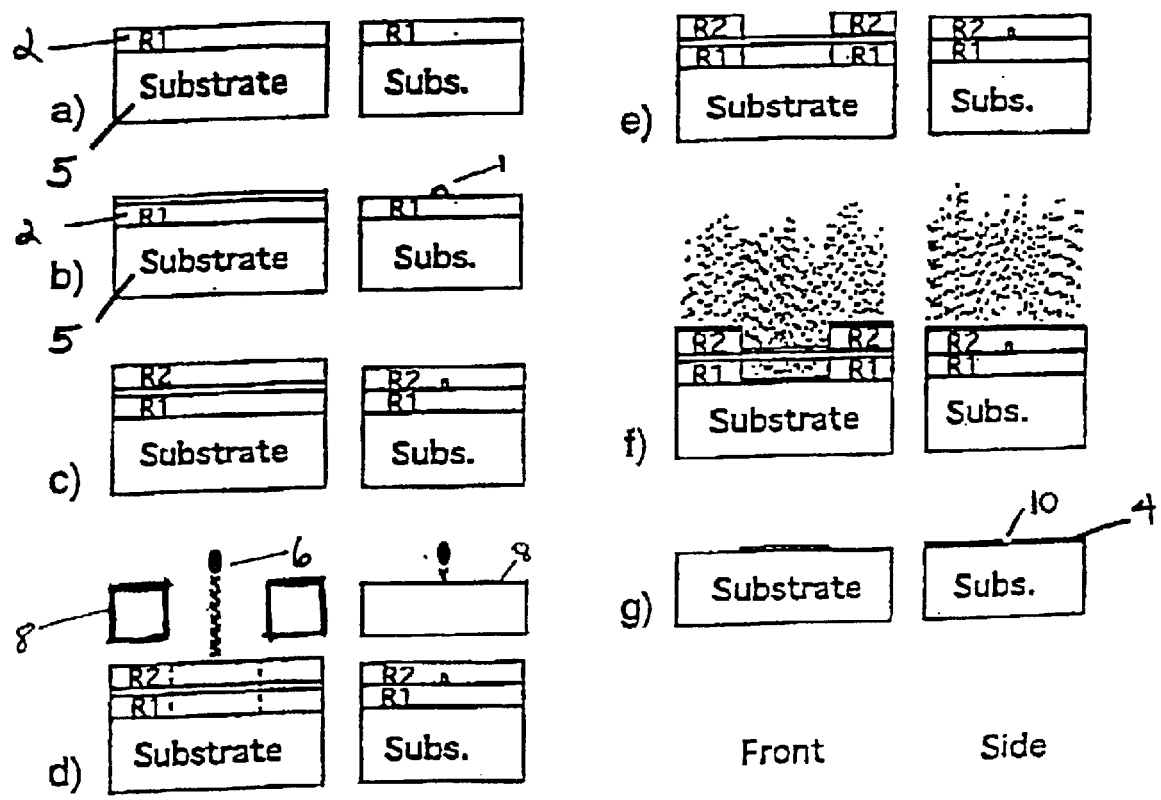
FIG. 2A shows a front plan view and a side plan view of the first layer on the substrate.
FIG. 2B shows a front plan view and a side plan view of the first layer on the substrate and the NT deposited thereon.
FIG. 2C shows a front plan view and a side plan view of the first layer on the substrate, the NT deposited thereon, and the second layer.
FIG. 2D shows a front plan view and a side plan view of the tri-layer system exposed by an electron beam.
FIG. 2E shows a front plan view and a side plan view of the developed trilayer system after the exposed portion is dissolved.
FIG. 2F shows a front plan view and a side plan view of the developed trilayer system and a metal film being deposited thereon.
FIG. 2G shows a front plan view of the substrate layer having a metal film thereon and a side plan view of the substrate with the metal film thereon having a nanogap.

NT 1 may be deposited on the first layer 2 in any known way. For example, NT 1 may be sonicated in an isopropanol solution, which is then deposited on top of the first layer 2, as shown in FIG. 2B. Sonication, which is well known in the art, involves placing NTs in a solution such as isopropanol or dichloroethane in a bath sonicator. Sonication breaks the nanotube material into individual SWNTs and small SWNT bundles. For example, a concentration of less than 0.1 mg/ml of the solution should be sonicated for about 6–8 hours. This produces a suspension of nanotube segments.

The position of the gap may be controlled by using optical or atomic force microscopy by locating NT on a resist surface. MWNTs made by arc discharge, or SWNTs made by laser ablation are located on the substrate using an optical microscope at a magnification of 1000× (with differential interference contrast enhancement) or an atomic force microscope (AFM) for nanotubes smaller than 20 nm in diameter.

A layer of NTs at random may be deposited, although patterning of an NT layer is also possible. Patterning may be attained by the methods described in J. Liu et al. "Controlled Deposition of Individual Single-Walled Carbon Nanotubes on Chemically Functionalized Templates" (Chemical Physics Letters 303 (1999) 125–129), incorporated herein by reference. As described therein, deposition of individual SWNTs on chemically-functionalized nanolithographic patterns enables a non-random positioning of individual NTs. J. Liu et al. describes a process where a positively charged —NH2 functionalized surface causes attraction of the negatively charged SWNTs, thus allowing a means of positioning the SWNTs in patterns.

A second layer 3 is then spun on top of the first layer 2 and baked at 190° C. The material of the second layer 3 may be the same as the first layer 2 or may be something different. As mentioned before, the second layer 3 is used for imaging patterns, thus may be made of material such as PMMA, photoresist, or other advanced e-beam resists. Since NTs are inert at temperatures below 900° C., the tri-layer system can be baked and otherwise prepared in the conventional fashion without any effect on the NTs. As shown in FIG. 2C, once the tri-layer is fabricated, the process is the same as a standard "liftoff" lithography process.

The tri-layer resist is then exposed by a 40 keV electron beam 6 with a pattern that consists of a 100–500 nm wide recess or continuous line crossing the NT 1. A mask 8 is provided above the second layer 3 so that electron beam 6 is projected across the mask and onto the two layers to form an exposed portion. The exposed portion is then removed in a conventional manner, such as by developing the exposed portion. As shown in FIG. 1 and FIG. 2E, upon development of the exposed portions of layers 2 and 3, the trapped carbon nanotube is left free standing above the substrate. Finally, metal film 4, such as gold, typically having a thickness less than that of the lower substrate layer is applied, as shown in FIG. 2F. For example, a metal film layer having a thickness of 25 nm is thermally evaporated with the NT 1 bridge preventing metal from reaching the area directly underneath it, namely a gap 10. The NT 1 "shadows" the substrate 5, creating a gap 10 in the metal line. The unexposed portions of layers 2 and 3 are then dissolved in acetone, a process well known in the art as "lift off". As shown in FIG. 2G, this step removes the unwanted metal on the resist and the NT 1.

As mentioned before, individual SWNTs, SWNT bundles, or MWNTs may be used as NTs. SWNT bundles are flexible, they sag and may touch the substrate if the lead is too wide. For a 20–30 nm bundle, a 300 to 400 nm wide lead is the upper limit. In contrast, MWNTs are much stiffer, so they can be used to make narrow gaps with widths exceeding 500 nm.

Figure 3:
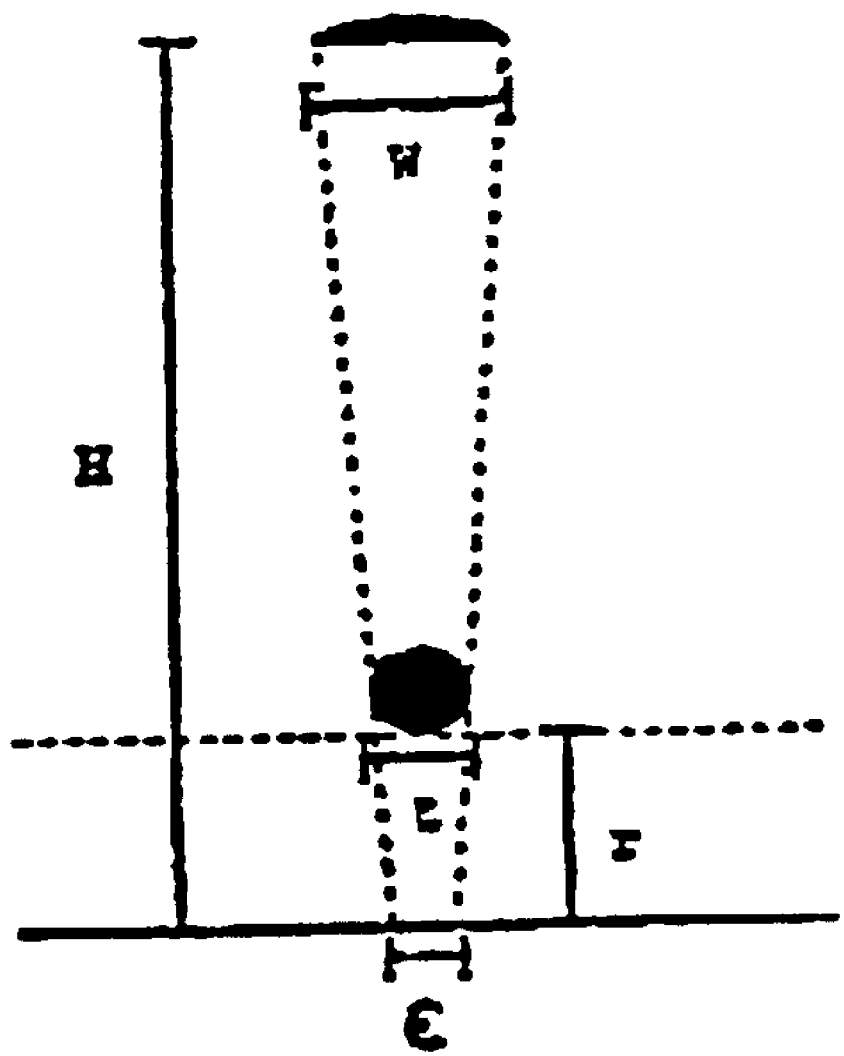
FIG. 3 is a graphical depiction showing the relationship of the gap size based on the resist trilayer geometry.

As shown in FIG. 3, the gap size $\epsilon$ is determined by geometry: the nanotube or bundle diameter t, the thickness of the bottom resist layer r, the evaporation source (metal film) distance H and the source width W, where $\epsilon=t-W(2r+t)/H$. Typical dimensions such as $t=20$ nm, $r=80$ nm, $W=0.5$ cm and $H=25$ cm give $\epsilon=16$ nm. The process can be controlled since fluctuations in t, r, W and H can systematically be reduced to below one percent if a monodispersion of tube diameter is used. A 1–2 nm gap can be fabricated using a 3–4 nm NT (or bundle) with a 40 nm thick resist layer and similar characteristics for the evaporation source.

Using the diameter of NT as a nanogap template confers a number of advantages. First, the size of the gap is controlled at the nanometer scale. If an SWNT bundle is used, the gap size is quantized. As separation processes for NTs improve, leading to a monodisperse product, control over the size of the nanogaps produced with this method will improve equally. Second, advances in self-assembly of NT networks will lead to advances in control over nanogap location and integration. Publications have reported self-assembled monolayers that attract NTs. (J. Liu et al. Chemical Physics Letters 303 (1999)125–129) When this process is incorporated in the present method, nanogaps may be placed with high precision. Finally, the present method offers the advantage of creating long, uniform nanogaps. For example, a 10 nm wide nanogap with a length of 500 nm has been created using the present method.

Two interesting properties of SWNTs worth studying at dimensions smaller than 100 nm are single electron charging in metallic tubs and the field effect behavior (or TUBEFET) in semiconducting tubes. It is expected, and indeed has already been shown with scanning tunneling spectroscopy, that the charging energy and the energy level spacing of a nanotube segment can exceed 50 meV, opening the possibility of quantum transport at room temperature. Reduced electrode spacing might also strongly influence the field effect behavior observed in semiconducting nanotubes. In the usual model, the field effect in micron-length tubes comes from a work function mismatch and energy band bending near the electrodes. Band bending in a short semiconducting SWNT bridging a nanogap should be suppressed if the electrode spacing is smaller than or equal to the distance over which the bending takes place.

Individual metallic and individual semiconducting SWNTs have been contacted by nanogaps with sub-30 nm width. For metallic nanotubes, single electron charging is observed with an 80 meV charging energy and a 20 meV energy level spacing. In semiconducting nanotubes, surprising observation is made that a strong field effect remains in such short samples. Anomalous features were found that are due to single electron charging.

SWNTs were contacted using the new nanogap fabrication method. Prior to making the nanogaps, raw SWNT material sonicated in dichloroethane was spun onto an $SiO_2$/Si substrate. Sonication in dichloroethane breaks the nanotube material into individual SWNTs and small SWNT bundles (2 to 5 nm diameter). The alignment of the electrodes with respect to the measured SWNTs is random (not to confuse with the carbon nanotube used to make the nanogap). At room temperature, two probe current-voltage (I–V) characteristics on nanogaps without SWNTs show a resistance in excess of 100 GΩ. When a SWNT or SWNT rope bridges a nanogap, the room temperature resistance varies between 100 kΩ and 3 GΩ. Since the contacted nanotubes are almost entirely covered with gold electrodes, they cannot be imaged with an AFM. Source-drain current (I) of a SWNT bridging the nanogap is recorded as a function of source-drain bias voltage (V) and tuning gate voltage(Vg).

Two characteristic behaviors were observed at 4.5 K for the differential conductance (dI/dV) as a function of bias and gate voltage. The first behavior was typical of single electron charging in metallic SWNTs with Coulomb blockade diamonds of different sizes and has been attributed to charging in a multiple dot structure. The maximum current at 0.1 V was 100 nA, corresponding to a resistance of 1 MΩ. From the largest diamonds, a charging energy $E_c$=80 meV and an energy level splitting of 20 meV was identified. These were an order of magnitude larger than reported previously and corresponded to a dot size below 30 nm. Although $E_c$ was larger than the room temperature thermal energy, no blockade was present at 300° K. At 77° K., the largest diamonds were still apparent.

The SWNTs bridging the nanogaps have typical lengths between 0.5 and 1.0 μm, which would give charging energies of 7–13 meV. Charging energies an order of magnitude larger that correspond to the electrode separation have been found. It is concluded that the electrodes break the nanotube into (at least) three segments, two under the electrodes and one short segment between the electrodes. Metallic SWNTs are known to be sensitive to local perturbations (e.g., strong bend, a top electrode, or a top bundle in a junction configuration) that create tunnel barriers and reduce the effective length of a metallic SWNT. The smaller diamonds in the irregular spectra strongly suggest that longer parts of the SWNT under the electrodes also contribute to transport. Since the top electrodes are not physically breaking the SWNT, but only altering the band structure via electrostatic screening or mechanical deformation, a finite transmission coefficient between the segments is expected. A metallic SWNT bridging a nanogap can therefore be modeled by three quantum dots in series, a small one in the nanogap and two larger ones beneath the electrodes.

For biases below 1.5 V, the conductance is less than 100 pS for −5 V≦Vg≦+15 V. For Vg≦−5 V, there is a bias dependent onset of current which decreases from 1.5 V to 0.1V as Vg is decreased from −5 V to −20 V. For a 1.0 V bias voltage, the conductivity increases by a factor of more than $10^4$ as Vg is swept from −5 V to −15 V. In contrast to measurements on longer semiconducting SWNTs, it is found that the gap in the I–V does not close, even at large negative Vg.

The field effect that is measured in semiconducting SWNTs differs in two main ways from previous observations. Considering that a 1.4 nm semiconducting SWNT has a band gap of 0.5V, a 1.5V bias should be more than sufficient to produce a finite current, in contrast to what is observed for Vg>−5 V. Similar to metallic SWNTs, it is expected that the semiconducting tube is effectively broken by the electrodes into (at least) three segments. In order for the SWNT to conduct, a bias of order the band gap must be applied to each segment individually, adding up to approximately 1.5 V. Also, tuning the Fermi energy into the valence band of the semiconducting SWNT should effectively make it a metallic tube with a finite conductance at low bias voltage. The 0.1 V gap present for −15 V≦Vg≦−12 V could be the result of single electron charging. A 0.1 eV charging energy is close to what was found for metallic SWNTs contacted by nanogaps. Streaks reminiscent of Coulomb blockade diamonds were apparent, but the usual diamond closure as the transport was completely blocked at small bias.

In conclusion, a novel method that uses carbon nanotubes to fabricate nanometer size breaks in metallic wires has been developed. SWNTs of length less than 30 nm have been contacted this way and two characteristic behaviors observed: single electron charging with very high energy scales in metallic SWNTs and, somewhat surprisingly, field effect transistor action in semiconducting SWNTs. Compared with other methods, the instant approach holds the possibility of scaleability. By using functionalized carbon nanotubes in a self-assembly process, multiple electrodes with nanogaps could be fabricated simultaneously in controlled locations.

We claim:

1. A method of fabricating nanogaps on an electrode, comprising the steps of:

coating a first resist layer onto a substrate;

depositing at least one carbon nanotube on the first resist layer;

coating a second resist layer over the first resist layer and the nanotube forming a trilayer component;

forming a pattern in the first resist layer and the second resist layer, wherein the pattern comprises a recess across which the carbon nanotube extends;

depositing a metal layer onto the substrate at the recess wherein the nanotube shadows the substrate, thereby creating a nanogap in the metal layer on the substrate; and dissolving the resist and the nanotube to form the electrode comprising the substrate and the nanogap within the metal layer.

2. The method of claim 1 wherein the carbon nanotube is selected from group consisting of a single wall carbon nanotube, a bundle of single wall carbon nanotubes, and a multi-wall carbon nanotube.

3. The method of claim 1 wherein the step of depositing the carbon nanotube onto the first resist layer further comprises the step of sonication of the carbon nanotube in an organic solvent solution, wherein the solution breaks the nanotube material into individual single wall carbon nanotubes and small bundles of single wall carbon nanotubes.

4. The method of claim 3 wherein the organic solvent is selected from group consisting of dichloroethane and isopropanol.

5. The method of claim 1, wherein the substrate is an oxidized silicon substrate.

6. The method of claim 1, wherein the resist material of the first resist layer and the second resist layer is polymethylmethacrylate.

7. The method of claim 1 wherein the step of forming a pattern comprises providing a mask above the second resist layer; projecting an electron beam across the mask and onto the first resist layer and the second resist layer to form an exposed portion; and dissolving the exposed portion of the resist.

8. The method of claim 1, wherein the step of dissolving the resist and nanotube comprises applying acetone.

9. The method of claim 1 wherein the nanogap width is determined by nanotube diameter and the resist trilayer geometry.

10. The method of claim 9 wherein the nanogap width is determined by the equation $\epsilon = t - W(2r+t)/H$, wherein the nanogap width is $\epsilon$, the nanotube diameter is $t$, thickness of the first resist layer is $r$, an evaporation source distance is $H$, and a source width is $W$.

11. The method of claim 1 wherein the nanogap diameter varies from 1 nm to 100 nm.

12. The method of claim 1 wherein the metal is gold.

13. The method of claim 1, wherein the metal layer has a thickness less than a thickness of the substrate layer.

14. The method of claim 1 wherein the recess is a continuous line, extending entirely across the substrate.

15. The method of claim 1 wherein the step of depositing the carbon nanotube comprises controlled positioning of the carbon nanotube by providing a chemically functionalized surface wherein the carbon nanotubes are attracted to the chemically functionalized surface.

16. The method of claim 15, wherein the chemically functionalized surface is an NH2 monolayer.

17. A method of fabricating nanogaps on an electrode, comprising the steps of:

coating a first layer onto a substrate;

depositing at least one carbon nanotube on the first layer;

coating a second layer over the first layer and the nanotube forming a trilayer component;

forming a pattern in the first layer and the second layer, wherein the pattern comprises a recess across which the carbon nanotube extends;

depositing a metal layer onto the substrate at the recess wherein the nanotube shadows the substrate, thereby creating a nanogap in the metal layer on the substrate; and dissolving the first layer, the second layer and the nanotube to form the electrode comprising the substrate and the nanogap within the metal layer.

18. The method of claim 17, wherein the first layer and the second layer are made of resist material.

19. The method of claim 17, wherein the first layer is made of material selected from the group consisting of polymethylmethacrylate, photoresist, polyimide, and any metal, and the second layer is made of material selected from the group consisting of polymethylmethacrylate and photoresist.

* * * * *